United States Patent
McCollough et al.

(10) Patent No.: US 6,242,956 B1
(45) Date of Patent: Jun. 5, 2001

(54) PHASE LOCKED LOOP

(75) Inventors: Kelvin E. McCollough, Austin, TX (US); Boaz Kochman, Ann Arbor, MI (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/425,880

(22) Filed: Oct. 22, 1999

(51) Int. Cl.$^7$ .................................................. H03L 7/06
(52) U.S. Cl. .......................... 327/159; 327/154; 327/157
(58) Field of Search ..................................... 327/157, 156, 327/159, 154, 558

(56) References Cited

U.S. PATENT DOCUMENTS

| | | | |
|---|---|---|---|
| 5,406,592 | * 4/1995 | Baumert | 375/376 |
| 5,552,942 | * 9/1996 | Ziperovich et al. | 360/51 |
| 5,724,008 | * 3/1998 | Ferraiolo et al. | 331/17 |
| 5,978,425 | * 11/1999 | Takla | 375/374 |

* cited by examiner

Primary Examiner—Toan Tran
Assistant Examiner—Cassandra Cox

(74) Attorney, Agent, or Firm—James L. Clingan, Jr.

(57) ABSTRACT

A hybrid phase locked loop employs both analog and digital circuitry. A digital to analog converter (DAC) provides a current output signal in conjunction with a current controlled oscillator (ICO). The hybrid phase locked loop employs the digital circuitry, among other reasons, to assist in generating an optimal feedback frequency signal before the loop of the hybrid phase locked loop is closed. The hybrid phase locked loop intelligently employs appropriate switching in strategically placed portions of the hybrid phase locked loop to ensure stable operation once the loop of the hybrid phase locked loop is closed. The hybrid phase locked loop employs baseline components in certain embodiments of the invention. These baseline components are those whose component values may vary significantly as a function of operating conditions, environmental perturbations, and which have relatively relaxed tolerances/precisions. The present implementation of a hybrid phase locked loop, as described in the invention, is capable of operating using a wide variety of components having relaxed tolerances/precisions, including intrinsic devices such as MOSFET capacitors. Such baseline components are employed in electronic devices where low cost is a rigid design constraint; the present invention is appropriate for such low cost applications.

19 Claims, 3 Drawing Sheets

PHASE LOCKED LOOP

BACKGROUND

1 Technical Field

The present invention relates generally to phase locked loop circuitry; and, more particularly, to phase locked loop circuitry employing current controlled oscillators

2 Related Art

Conventional phase locked loop technologies commonly suffer from a necessity for precision components to operate in a substantially predictable and stable manner. Where such precision components are available, conventional technologies operate with sufficient reliability as dictated by present industrial standards. However, the direction of much of the semiconductor industry is towards cheaper and more embedded components that typically suffer from poor tolerances. For example, it is not uncommon for particular component values in many phase locked loops to vary as great as plus or minus 50% of the predetermined and expected component value. Additionally, environmental perturbations having relatively long time constant responses, including temperature variations and aging of the components, among other perturbations, may result in a drift of particular components values over time within a conventional phase locked loop.

Other real time perturbations having significantly shorter time constant responses, such as electromagnetic interference and radio frequency interference, as well as intrinsic parasitics within an integrated circuit, among others electrical and magnetic perturbations, may result in dynamic component value change. In other words, the dynamic range over which the individual components may drift as a function of time may result in undesirable performance degradation of the conventional phase locked loop. Such effects are undesirable, in that, they can result in the drift of the center operating frequency at which the phase locked loop is intended to operate. There is commonly a trade-off of stability in operation, as well as a trade-off of precision in center frequency tuning, that is governed by the imprecision of the individual components available for phase locked loops.

FIG. 1 is a system diagram illustrating a conventional embodiment of a prior art phase locked loop 100. A reference frequency signal is fed into a phase/frequency detector (PFD) 110. The phase/frequency detector (PFD) 110 provides an error signal using an output that is fed into at least one charge pump. In the conventional embodiment 100 of a prior art phase locked loop, a charge pump 120 and a charge pump 170 are provided with the error signal generated by the phase/frequency detector (PFD) 110. The charge pump 120 and the charge pump 170 are both fed into low pass filter circuitry 130. The low pass filter circuitry 130 additionally contains integrating circuitry 132. A center frequency current generator 140 provides an initial candidate current for the conventional embodiment 100 of a prior art phase locked loop. The center frequency current generator 140 initially feeds a current controlled oscillator (ICO) 150 that generates an original candidate frequency. The original candidate frequency is scaled using a divider (÷N) 160, and the resultant is returned as a feedback frequency signal to the phase/frequency detector (PFD) 110. This feedback frequency signal completes the closed loop of the conventional embodiment 100 of a prior art phase locked loop.

The conventional embodiment of a prior art phase locked loop 100 typically suffers from deleterious operational effects stemming primarily from the variations of component values. Commonly, the center frequency current generator 140 is employed using a pull-up resistor coupled to a voltage source, known well to those having skill in the art of electronic and semiconductor devices. A poor tolerance/precision of the pull-up resistor can result in a initial candidate frequency that differs substantially from that frequency to which the conventional embodiment of a prior art phase locked loop 100 will eventually lock. Both the precision of the pull-up resistor and any additional imprecision of individual components that are used within the integrating circuitry 132 can accentuate instability and poor performance of operation within the conventional embodiment of a prior art phase locked loop 100. Ideally, the integrating circuitry 132 is used to perform compensation for any imprecise operation of the center frequency current generator 140.

Various conventional methods known to those having skill in the art of electronic and semiconductor devices for performing the integration of the integrating circuitry 132 are envisioned in the conventional embodiment of a prior art phase locked loop 100. Each of these conventional methods suffers from unique deleterious operation. Typical conventional embodiments commonly do not employ baseline components in the stead of precision components within the integrating circuitry 132. Baseline components include those components that are at the lowest possible tolerance/precision that may still be used for operation within the conventional embodiment of a prior art phase locked loop 100. Such baseline components are employed in electronic devices where low cost is a rigid design constraint. For example, a baseline capacitor may be obtained from the use of a metal oxide semiconductor field effect transistor (MOSFET). The capacitor component value of such an intrinsic device may vary across a relatively large percentage of its nominal value when biased across a relatively small operational voltage range.

When such a baseline capacitor is employed in the integrating circuitry 132, a potentially poor selection of the initial candidate center frequency, as determined by the center frequency current generator 140, cannot be adequately compensated to bring it into line with a desired center frequency. For example, when both the pull-up resistor of the center frequency current generator 140 has a relatively poor tolerance/precision and the baseline capacitor employed in the integrating circuitry 132 similarly suffers in precision for, among other reasons, those stated above for baseline components, the total operation of the conventional embodiment of a prior art phase locked loop 100 may become unstable. This instability may occur when the baseline capacitor, as employed in the integrating circuitry 132, does not possess sufficient dynamic range to compensate for the imprecision of the initial candidate frequency as governed by the center frequency current generator 140. The integrating circuitry 132 of the conventional embodiment of a prior art phase locked loop 100 cannot sufficiently tune in response to the imprecision of the pull-up resistor within the center frequency current generator 140. This instability may be viewed as having a cascading effect whose total effect is contributed by the individual component imprecision within various circuitry within the entire phase locked loop.

For certain embodiments of integrating circuitry 132 that do possess sufficient tuning capability to compensate for imprecision of a pull-up resistor employed in the center frequency current generator 140, any undesirable dynamic range limitations may be imposed upon any supporting circuitry that feeds the integrating circuitry 132. In the conventional embodiment of a prior art phase locked loop 100 illustrated in FIG. 1, the charge pump 170 would receive the imposition of dynamic range constraints to provide stable operation of the phase locked loop. In other words, the unstable operation generated by imprecision of the pull-up resistor employed in the center frequency current generator 140 is undesirably cascaded through the compensating circuitry of the entire conventional embodiment of a prior art phase locked loop 100.

Further limitations and disadvantages of conventional and traditional systems will become apparent to one skilled in the art through comparison of such systems with the present invention as set forth in the remainder of the present application with reference to the drawings.

DETAILED DESCRIPTION OF THE INVENTION

Figure 1:
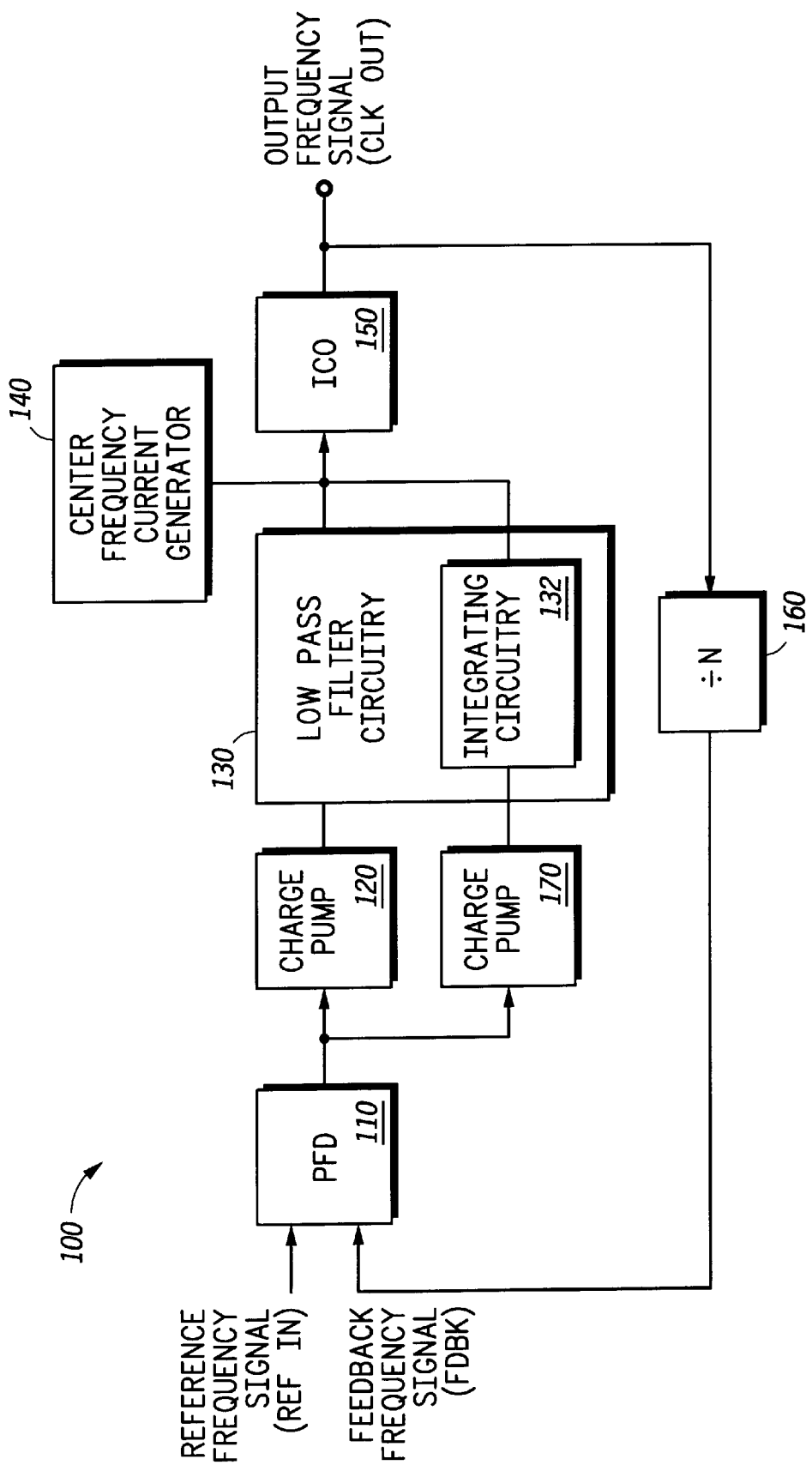
FIG. 1 is a system diagram illustrating a conventional embodiment of a prior art phase locked loop.
Figure 2:
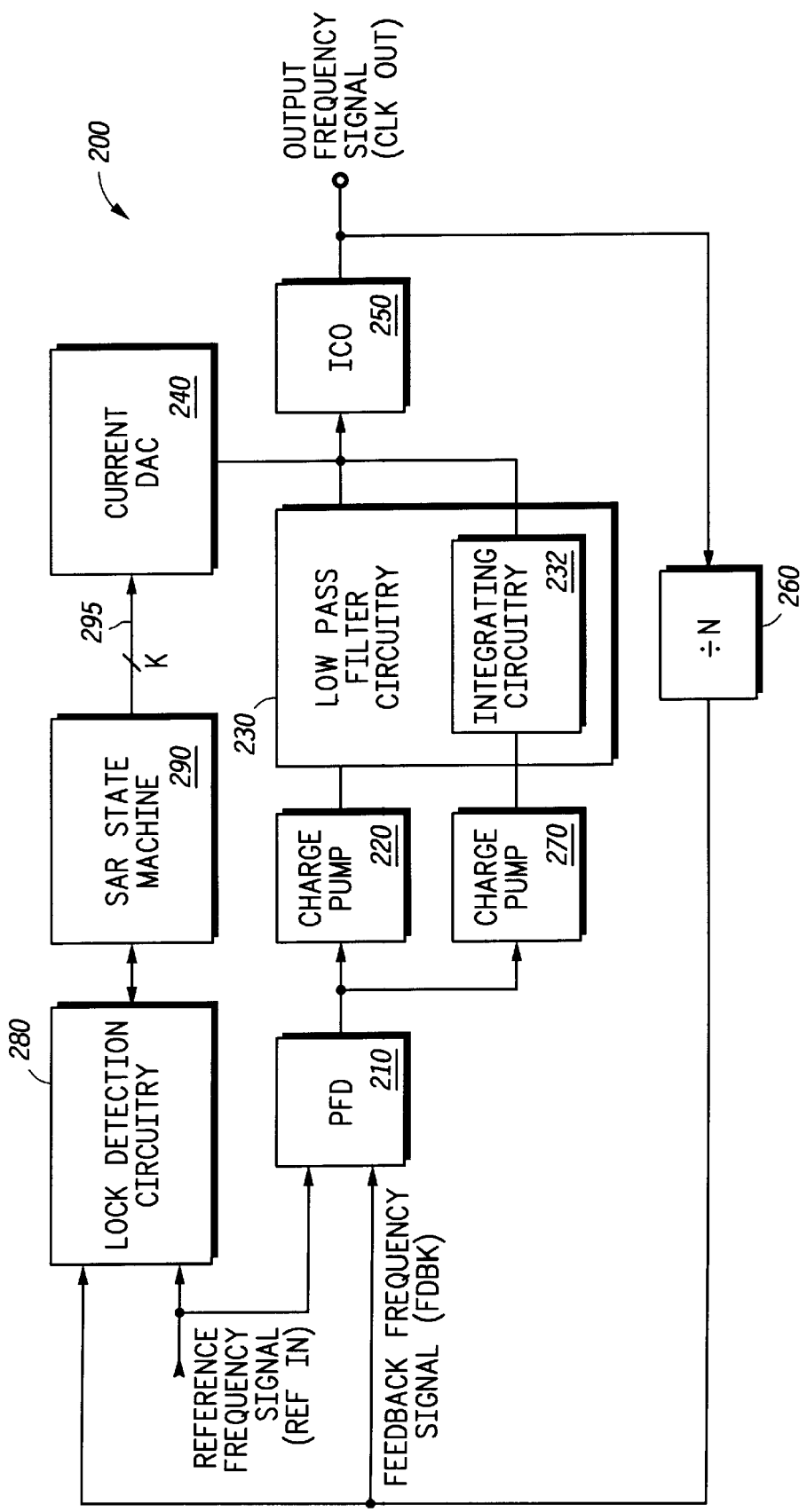
FIG. 2 is a system diagram illustrating one embodiment of the invention that operates a hybrid phase locked loop using both analog and digital processing circuitry.

FIG. 2 is a system diagram illustrating one embodiment of the invention that operates a hybrid phase locked loop 200 using both analog and digital processing circuitry. A reference frequency signal, such as a reference clock, is fed into a phase/frequency detector (PFD) 210 using at least one of at least two inputs. The phase/frequency detector (PFD) 210 provides an error signal using an output that is fed into at least one charge pump. A charge pump 220 and a charge pump 270 are provided with the error signal generated by the phase/frequency detector (PFD) 210. The charge pump 220 and the charge pump 270 are both fed into low pass filter circuitry 230. The low pass filter circuitry 230 additionally contains integrating circuitry 232. A digital to analog converter (DAC) providing a current output signal 240 provides an initial candidate current for the hybrid phase locked loop 200. The digital to analog converter (DAC) providing a current output signal 240 initially feeds a current controlled oscillator (ICO) 250 that generates an original candidate frequency. The original candidate frequency is reduced using a divider (÷N) 260, and the resultant is returned as a feedback frequency signal to the phase/frequency detector (PFD) 210. The feedback frequency signal is a feedback clock in certain embodiments of the invention. The feedback frequency signal completes the closed loop of the hybrid phase locked loop 200. The feedback frequency signal is simultaneously fed into lock detection circuitry 280; additionally, the reference frequency signal is fed into the lock detection circuitry 280. The lock detection circuitry 280 provides an output signal that feeds a successive approximation register (SAR) state machine 290. A multi-bit control word is provided from the successive approximation register (SAR) state machine 290 via a multi-bit control line 295 to the digital to analog converter (DAC) providing a current output signal 240.

In certain embodiments of the invention, the digital to analog converter (DAC) providing a current output signal 240 provides an initial current to the current controlled oscillator (ICO) 250 to generate a minimum operating frequency prior to generating an optimal center frequency and prior to the closing of the loop of the hybrid phase locked loop 200. Once the reference is detected by the lock detection circuitry 280, the successive approximation register (SAR) state machine 290 asserts a most significant bit and transmits it via the multi-bit control line 295 to the digital to analog converter (DAC) providing a current output signal 240. After waiting until the frequency generated from the current controlled oscillator (ICO) 250 stabilizes, the reference frequency signal and the feedback frequency signal are compared within the successive approximation register (SAR) state machine 290 after having passed through and been converted by the lock detection circuitry 280; a modified control word is then transmitted via the multi-bit control line 295 to the digital to analog converter (DAC) providing a current output signal 240. The digital to analog converter (DAC) providing a current output signal 240 then provides a current for the current controlled oscillator (ICO) 250 to generate a feedback frequency signal that is as close a match as possible to the reference frequency signal. The mismatch between the feedback frequency signal and the reference frequency signal is governed by the resolution of the digital to analog converter (DAC) providing a current output signal 240. It is at this point that the analog portion of the loop of the hybrid phase locked loop 200 is closed to tune the feedback frequency signal to that of the reference frequency signal.

The successive approximation register (SAR) state machine 290 maintains the final operational state such that the digital to analog converter (DAC) providing a current output signal 240 continues to provide the optimal output current to the current controlled oscillator (ICO) 250. The hybrid phase locked loop 200 will continue to operate in this steady-state mode of operation absent some change in the reference input signal as reflected in a new divider (÷N) 260 value or the divider (÷N) 260. Additional perturbations that would open the loop of the hybrid phase locked loop 200 and commence the initialization process described above include, among other things, power cycling.

Figure 3:
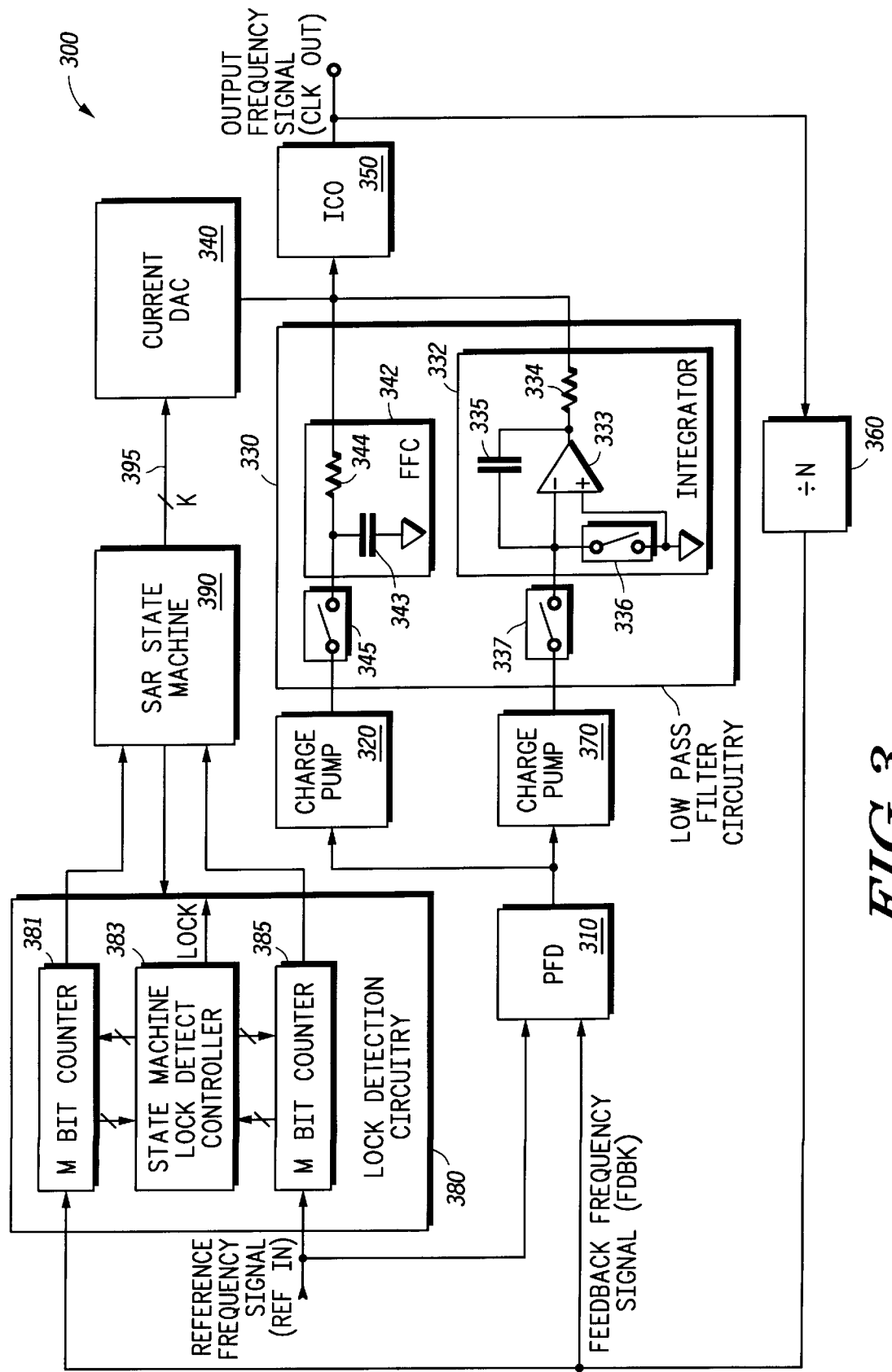
FIG. 3 is a system diagram illustrating a specific embodiment of the hybrid phase locked loop of FIG. 2.

FIG. 3 is a system diagram illustrating a specific embodiment of the hybrid phase locked loop 300 of FIG. 2. A reference frequency signal is fed into a phase/frequency detector (PFD) 310. The phase/frequency detector (PFD) 310 provides an error signal that is fed into at least one charge pump. A charge pump 320 and a charge pump 370 are provided with the error signal generated by the phase/frequency detector (PFD) 310. The charge pump 320 and the charge pump 370 are both fed into low pass filter circuitry 330. The low pass filter circuitry 330 additionally contains an integrator 332 and a feed forward compensator (FFC) 342. The charge pump 320 feeds to the feed forward compensator (FFC) 342 via a switch 345. The feed forward compensator (FFC) 342 additionally contains a capacitor 343 and a resistor 344. The charge pump 370 feeds to the integrator 332 via a switch 337. The integrator 332 additionally contains an operational amplifier 333, a capacitor 335, a resistor 334, and a switch 336.

A digital to analog converter (DAC) providing a current output signal 340 provides an initial candidate current for the hybrid phase locked loop 300. The digital to analog converter (DAC) providing a current output signal 340 initially feeds a current controlled oscillator (ICO) 350 that generates an original candidate frequency. The original candidate frequency is reduced using a divider (÷N) 360, and the resultant is returned as a feedback frequency signal to the phase/frequency detector (PFD) 310. The feedback frequency signal completes the closed loop of the hybrid phase locked loop 300. The feedback frequency signal is simultaneously fed into lock detection circuitry 380; additionally, the reference frequency signal is fed into the lock detection circuitry 380. The lock detection circuitry 380 additionally contains a first M-bit counter 381 and a second M-bit counter 385, each of which is coupled to a state machine lock detect controller 383 via bidirectional, multi-bit control lines.

The lock detection circuitry 380 provides an output signal that feeds a successive approximation register (SAR) state machine 390. A multi-bit control word is provided from the successive approximation register (SAR) state machine 390 via a multi-bit control line 395 to the digital to analog converter (DAC) providing a current output signal 340.

In certain embodiments of the invention, the digital to analog converter (DAC) providing a current output signal 340 provides an initial current to the current controlled oscillator (ICO) 350, via a current summing node, to generate a minimum operating frequency prior to generating an optimal center frequency and prior to the closing of the loop of the hybrid phase locked loop 300. The switch 345 and the switch 337 are opened during this start-up operational mode of the hybrid phase locked loop 300. The switch 336 is closed, and the operational amplifier 333 is in a tri-state mode providing a high output impedance. By maintaining the switch 336 closed and the operational amplifier 333 in a tri-state mode, the proper bias is established across the capacitor 335 ensuring stable operation of the hybrid phase locked loop 300 when the loop is subsequently closed. Additionally, the first M-bit counter 381 and the second M-bit counter 385 are each cleared by the lock detection circuitry 380 during this start-up operational mode.

Once the reference is detected by the lock detection circuitry 380, the successive approximation register (SAR) state machine 390 asserts a most significant bit and transmits it via the multi-bit control line 395 to the digital to analog converter (DAC) providing a current output signal 340. After waiting until the frequency generated from the current controlled oscillator (ICO) 350 stabilizes, the reference frequency signal and the feedback frequency signal, after having been scaled by the divider (÷N) 360, are each fed into the lock detection circuitry 380. The lock detection circuitry 380 initiates each of the first M-bit counter 381 and the second M-bit counter 385 simultaneously. The first M-bit counter 381 and the second M-bit counter 385 each operate until at least one of them overflows; the state machine lock detect controller 383 then reinitiates each of the first M-bit counter 381 and the second M-bit counter 385 simultaneously. This process is repeated a predetermined number of times as determined by the lock detection circuitry 380 as governed by, among other things, the settling time of the current controlled oscillator (ICO) 350. Ultimately, the process is repeated another time at which point the successive approximation register (SAR) state machine 390 receives an overflow signal from either of the first M-bit counter 381 or the second M-bit counter 385. Dependent upon which of the first M-bit counter 381 or the second M-bit counter 385 overflows, the successive approximation register (SAR) state machine 390 either retains the bit states being tested or negates the bit. For example, if the reference frequency signal is greater than the feedback frequency signal, the first M-bit counter 385 would overflow first causing the successive approximation register (SAR) state machine 390 to negate the bit being tested. Each of the remaining bits are tested in similar fashion.

The successive approximation register (SAR) state machine 390 then generates a most significant bit of a multi-bit control word that it transmits via the multi-bit control line 395 to the digital to analog converter (DAC) providing a current output signal 340. The feedback frequency signal, provided by the current controlled oscillator (ICO) 350, is then modified in response to the most significant bit. The counting process is then repeated to generate the remaining bits of the multi-bit control word. A resultant feedback frequency is generated after the multi-bit control word is fed into the digital to analog converter (DAC) providing a current output signal 340 that provides a current to the current controlled oscillator (ICO) 350. The resultant feedback frequency is optimal given the resolutions of the lock detection circuitry 380, the successive approximation register (SAR) state machine 390, and the digital to analog converter (DAC) providing a current output signal 340.

Once the optimal feedback frequency signal is achieved, the switch 336 is opened, and the switch 345 and the switch 337 are closed; the analog portion of the loop of the hybrid phase locked loop 300 is closed at this point. The successive approximation register (SAR) state machine 390 maintains the final operational state such that the digital to analog converter (DAC) providing a current output signal 340 continues to provide the optimal output current to the current controlled oscillator (ICO) 350. The hybrid phase locked loop 300 will continue to operate in this steady-state mode of operation absent some change in the reference input signal or the divider (÷N) 360. Additional perturbations that would open the loop of the hybrid phase locked loop 300 and commence the initialization process described above include, among other things, power cycling.

The invention, as described above, is directly applicable, in certain embodiments of the invention, for operation as a hybrid phase locked loop that operates cooperatively with a micro-controller in a transportation system. The hybrid phase locked loop contains both analog circuitry and digital circuitry. Certain embodiments of the invention that are implemented as a hybrid phase locked loop having both analog circuitry and digital circuitry, are operated in an automotive capacity to control at least one function within the transportation system. The digital circuitry provides the original candidate frequency, as described above in various embodiments of the invention, and the analog circuitry operates cooperatively with the digital circuitry to perform the phase locking of the hybrid phase locked loop. A current digital to analog converter (DAC) provides a resultant analog output signal that operates cooperatively with a micro-controller in the transportation system.

The hybrid phase locked loop, built in accordance with the present invention, provides an integrated solution that overcomes many of the undesirable deficiencies of conventional phase locked loops while borrowing on the integration of the digital circuitry to generate the original candidate frequency. The implementation of the digital circuitry to generate the original candidate frequency provides superior performance and operating speed for the hybrid phase locked loop as compared to traditional phase locked loop technologies.

In view of the above detailed description of the present invention and associated drawings, other modifications and variations will now become apparent to those skilled in the art. It should also be apparent that such other modifications and variations may be effected without departing from the spirit and scope of the present invention.

What is claimed is:

1. A phase locked loop, comprising:
   a phase/frequency detector having a first input for receiving a reference clock, a second input, and an output;
   a first charge pump coupled to the output of the phase/frequency detector;

a second charge pump coupled to the output of the phase/frequency detector;

a feed forward compensation circuit coupled to the first charge pump;

an integrator coupled to the second charge pump;

a current controlled oscillator having an input coupled to the integrator and the feed forward compensation circuit and having an output;

a divider having an input coupled to the output of the current controlled oscillator and an output coupled to the second input of the phase/frequency detector; and a current digital to analog converter having an output coupled to the input of the current controlled oscillator.

2. The phase locked loop of claim 1, further comprising:

a successive approximation register state machine having an output coupled to the current digital to analog converter;

a first counter having an input for receiving the reference clock and an output coupled to the successive approximation register state machine; and a second counter having an input coupled to the second input of the phase/frequency detector and an output coupled to the successive approximation register state machine.

3. The phase locked loop of claim 1 wherein the current digital to analog converter receives a control word.

4. The phase locked loop of claim 3, further comprising a control circuit which initially provides the control word at a predetermined state.

5. The phase locked loop of claim 4, wherein the control circuit changes the state of the digital control word in response to a difference in frequency between the output of the divider and the reference clock.

6. A phase locked loop having a current summing node at an input to a current controlled oscillator comprising:

a low pass filter having an output coupled to the current summing node; and a current digital to analog converter having an output coupled to the summing node, wherein the current digital to analog converter possesses a capability of supplying current over a first current range and the low pass filter has a capability of supplying current over a second current range, wherein the first current range is greater than the second current range.

7. The phase locked loop of claim 6, wherein the current digital to analog converter is adjusted to a desired current during a first time period prior to analog portion of the phase locked loop being engaged and to a substantially constant current during a subsequent second time period.

8. The phase locked loop of claim 7, wherein the low pass filter is disabled during the first time period.

9. The phase locked loop of claim 7, wherein the current digital to analog converter provides a current responsive to a state of a digital control word.

10. A phase locked loop having a lock detector circuit which receives a reference clock and a feedback clock from a current controlled oscillator that provides an output signal at a frequency determined by an input current provided at an input thereof, comprising:

a state machine, coupled to the lock detector circuit, that outputs a control word;

a current circuit having an input for receiving the reference clock and a current output coupled to the input of the current controlled oscillator; and a current digital to analog converter having an input for receiving the control word and an output coupled to the input of the current controlled oscillator.

11. The phase locked loop of claim 10, wherein the state machine is responsive to a difference in frequency between the reference clock and the feedback clock during the first time period.

12. The phase locked loop of claim 10, wherein the current circuit is disabled during the first time period.

13. The phase locked loop of claim 12 wherein the current circuit comprises an integrator, wherein the integrator comprises:

an amplifier having a negative input, an output, and a positive input coupled to a negative power supply terminal;

a capacitor having a first terminal coupled to the negative input of the amplifier and a second terminal coupled to the output of the amplifier;

a resistor having a first terminal coupled to the output of the amplifier and a second terminal coupled to the input of the current controlled oscillator;

a first switch coupled between the lock detector circuit and the negative input of amplifier; and a second switch coupled between the negative input and the positive input of the amplifier.

14. A method of operating a phase locked loop having an output clock responsive to a current supplied to an input of a current controlled oscillator, comprising the steps of:

varying current to the input of the current controlled oscillator from a first source during a first time period;

providing a fixed current from the first source during a second time period following the first time period; and providing a variable current from a second source during the second time period; wherein the first source is a current digital to analog converter.

15. The method of claim 14, wherein the second source is a low pass filter.

16. A method of operating a phase locked loop having an output clock responsive to a current supplied to an input of a current controlled oscillator, and a reference clock and a feedback clock responsive to the current controlled oscillator, comprising the steps of:

varying current to the input of the current controlled oscillator from a first source during a first time period;

providing a fixed current from the first source during a second time period following the first time period; and providing a variable current from a second source during the second time period;

supplying the current to the current controlled oscillator at a predetermined magnitude;

determining if the reference clock is at a higher frequency than the feedback clock; and varying the current to the input of the current controlled oscillator by supplying the current to the current controlled oscillator at a predetermined magnitude.

17. A hybrid phase locked loop that operates cooperatively with a micro-controller in a transportation system, the phase locked loop comprising:

a digital circuitry that provides an original candidate frequency;

an analog circuitry that is communicatively coupled to the digital circuitry and that operates cooperatively with the digital circuitry to perform the phase locking of the phase locked loop; and a current digital to analog converter that is communicatively coupled to at least one of the digital circuitry and the analog circuitry and that provides an analog output from the phase locked loop, wherein the digital circuitry further comprises a lock detection circuitry, the lock detection circuitry having a state machine lock detect controller.

18. A hybrid phase locked loop that operates cooperatively with a micro-controller in a transportation system responsive to a frequency selected from a predetermined plurality of candidate frequencies, the phase locked loop comprising:

a digital circuitry that provides an original candidate frequency selected from the predetermined plurality of candidate frequencies;

an analog circuitry that is communicatively coupled to the digital circuitry and that operates cooperatively with the digital circuitry to perform the phase locking of the phase locked loop; and a current digital to analog converter that is communicatively coupled to at least one of the digital circuitry and the analog circuitry and that provides an analog output from the phase looked loop.

19. A hybrid phase locked loop that operates cooperatively with a micro-controller in a transportation system, the phase locked loop comprising:

a digital circuitry that provides an original candidate frequency;

an analog circuitry that is communicatively coupled to the digital circuitry and that operates cooperatively with the digital circuitry to perform the phase locking of the phase locked loop; and a current digital to analog converter that is communicatively coupled to at least one of the digital circuitry and the analog circuitry and that provides an analog output from the phase locked loop, wherein the analog circuitry further comprises a low pass filter circuitry and a feed forward compensator.

* * * * *